(12) United States Patent
Kim et al.

(10) Patent No.: US 12,745,553 B2
(45) Date of Patent: Sep. 22, 2026

(54) DISPLAY DEVICE COMPRISING FLEXIBLE SUBSTRATE WITH PLURALITY OF PIXELS HAVING IMPROVED HEAT DISSIPATION CHARACTERISTIC

(71) Applicant: SAMSUNG DISPLAY CO., LTD., Yongin-si (KR)

(72) Inventors: Jaewoo Kim, Yongin-si (KR); Yoon-Ho Kim, Yongin-si (KR); Jeong-Young Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 309 days.

(21) Appl. No.: 18/450,587

(22) Filed: Aug. 16, 2023

(65) Prior Publication Data

US 2024/0206305 A1 Jun. 20, 2024

(30) Foreign Application Priority Data

Dec. 16, 2022 (KR) ........................ 10-2022-0177345

(51) Int. Cl.
*H10K 59/90* (2026.01)
*H05K 1/14* (2006.01)
*H10K 59/131* (2023.01)

(52) U.S. Cl.
CPC ............. *H10K 59/90* (2023.02); *H05K 1/147* (2013.01); *H10K 59/131* (2023.02); *H05K 2201/10128* (2013.01)

(58) Field of Classification Search
CPC ......... H05K 1/147; H05K 2201/10128; H10K 59/131; H10K 59/90; H10K 2102/311;
(Continued)

(56) References Cited

U.S. PATENT DOCUMENTS

2009/0310057 A1 12/2009 Kang et al.
2019/0019855 A1* 1/2019 Park ...................... H05K 1/117
(Continued)

FOREIGN PATENT DOCUMENTS

KR 10-2009-0129559 A 12/2009
KR 10-1449075 10/2014
(Continued)

OTHER PUBLICATIONS

Office Action dated Jul. 1, 2026 in related Korean Patent Application No. 10-2022-0177345, 8 pages, in Korean.
(Continued)

*Primary Examiner* — Didarul A Mazumder
(74) *Attorney, Agent, or Firm* — F. CHAU & ASSOCIATES, LLC

(57) ABSTRACT

A display device comprises a display substrate including a display area on which a plurality of pixels are disposed and a pad area adjacent to an one side of the display area, a cover panel disposed under the display substrate, a first circuit board electrically connected to the pad area, a second circuit board electrically connected to the first circuit board and disposed under the cover panel, a control chip mounted on a first surface of the second circuit board, and an adhesive layer attaching the second circuit board to the cover panel and, when viewed in a plan view, defining an opening exposing a portion of the second circuit board at which the control chip is disposed.

21 Claims, 10 Drawing Sheets

(58) Field of Classification Search
CPC ... H10K 59/8791; H10K 77/111; H10K 59/12
USPC ............................................... 257/91; 438/22
See application file for complete search history.

(56) References Cited

U.S. PATENT DOCUMENTS

| | | | | |
|---|---|---|---|---|
| 2019/0116405 | A1* | 4/2019 | Noh | G06F 1/1626 |
| 2019/0326367 | A1* | 10/2019 | Jung | G06V 40/13 |
| 2020/0341576 | A1* | 10/2020 | Kahng | G06F 3/0412 |
| 2020/0363882 | A1* | 11/2020 | Nam | H05K 1/147 |
| 2021/0288282 | A1 | 9/2021 | Kim et al. | |
| 2022/0123072 | A1* | 4/2022 | Kim | H05K 3/321 |

FOREIGN PATENT DOCUMENTS

| | | |
|---|---|---|
| KR | 10-2016-0141260 | 12/2016 |
| KR | 10-2168236 | 10/2020 |
| KR | 10-2021-0080945 | 7/2021 |
| KR | 10-2021-0116784 A | 9/2021 |
| KR | 10-2022-0021995 | 2/2022 |

OTHER PUBLICATIONS

Office Action dated Jul. 1, 2026 in related Korean Patent Application No. 10-2022-0177345, 9 pages, English Translation.

* cited by examiner

DP
TFE3
TFE2
TFE1
TFE
IL5
IL4
IL
IL3
IL2
IL1
BL
SUB
PX
TR1
TR2
CAP
LE
I'
I
DE1
CAPE
GE1
CAP
AL1
SE1
TR1
AE
EML
CE
DE2
GE2
AL2
SE2
TR2
AP
DR1
DR2

DD3
FPCB-P1
PA
WS
BZL
ARL
TFE
DP
AP
CP
FPCB
OA1
FPCB-P2
CT
FPCB-P3
MPCB
C-IC
AM
MPCB-P1
MPCB-P2
II
II'
DR2
DR1

DD4
AP-P1
WS
BZL
ARL
TFE
DP
AP
CP
AP-P2
OA1
PA
AM
MPCB
AP-P3
FPCB
CT
C-IC
MPCB-P2
MPCB-P1
II
II'
DR2
DR1

DISPLAY DEVICE COMPRISING FLEXIBLE SUBSTRATE WITH PLURALITY OF PIXELS HAVING IMPROVED HEAT DISSIPATION CHARACTERISTIC

CROSS-REFERENCE TO RELATED APPLICATION

This application claims priority to Korean Patent Application No. 10-2022-0177345, filed on Dec. 16, 2022, and all the benefits accruing therefrom under 35 USC § 119, the content of which in its entirety is herein incorporated by reference.

BACKGROUND

1. Field

Embodiments relate to display device. More particularly, embodiments relate to a display device that provides visual information.

2. Description of the Related Art

With the development of information technology, the importance of a display device, which is a connection medium between a user and information, has been highlighted. For example, the use of display devices such as liquid crystal display device ("LCD"), organic light emitting display device ("OLED"), plasma display device ("PDP"), and quantum dot display device is increasing.

Meanwhile, heat generated from a control chip of the display device may be transferred to a display substrate. In this case, there are problems that characteristics of transistors included in a pixel of the display substrate may change and lifespan of a light emitting element included in the pixel of the display substrate may be reduced.

SUMMARY

Embodiments provide a display device having improved heat dissipation characteristic.

A display device according to an embodiment of the present disclosure includes a display substrate including a display area on which a plurality of pixels are disposed and a pad area adjacent to an one side of the display area, a cover panel disposed under the display substrate, a first circuit board electrically connected to the pad area, a second circuit board electrically connected to the first circuit board and disposed under the cover panel, a control chip mounted on a first surface of the second circuit board, and an adhesive layer attaching the second circuit board to the cover panel and, when viewed in a plan view, defining an opening exposing a portion of the second circuit board at which the control chip is disposed.

A second surface, opposite to the first surface, of the second circuit board contacts the adhesive layer.

The display device further includes an anti-reflection layer is disposed on the display substrate.

The first circuit board includes a first part overlapping a part of the pad area, a second part having a curved shape extending around the cover panel and a first end connected to the first part, and a third part disposed under the cover panel and connected to a second end, opposite to the first end, of the second part.

The adhesive layer includes a first adhesive portion and a second adhesive portion. When viewed in a plan view, the opening is disposed between the first adhesive portion and the second adhesive portion. When viewed in a plan view, each of the first adhesive portion and the second adhesive portion is spaced apart from the control chip.

The adhesive layer defines a first passage area and a second passage area exposing a second surface, opposite to the first surface, of the second circuit board between the first adhesive portion and the second adhesive portion. The adhesive layer contacts the second surface of the second circuit board. When viewed in a plan view, the first passage area and the second passage area face each other with the control chip interposed therebetween.

The adhesive layer includes first, second, third, and fourth adhesive portions spaced apart from each other. When viewed in a plan view, each of the first, second, third, and fourth adhesive portions is spaced apart from the control chip.

The adhesive layer defines first, second, third, and fourth passage areas exposing a second surface, opposite to the first surface, of the second circuit board between the first adhesive portion and the second adhesive portion, between the second adhesive portion and the third adhesive portion, between the third adhesive portion and the fourth adhesive portion, and the fourth adhesive portion and the first adhesive portion, respectively. The adhesive layer contacts the second surface of the second circuit board. When viewed in a plan view, the first passage area and the third passage area face each other with the control chip interposed therebetween, and the second passage area and the fourth passage area face each other with the control chip interposed therebetween.

The display substrate includes a first part on which the plurality of pixels are disposed, a second part having a curved shape extending around the cover panel and a first end connected to the first part, and a third part disposed under the cover panel and connected to a second end, opposite to the first end, of the second part.

A display device according to an embodiment of the present disclosure includes a display substrate including a display area on which a plurality of pixels are disposed and a pad area adjacent to an one side of the display area, a cover panel disposed under the display substrate, a first circuit board electrically connected to the pad area, a second circuit board electrically connected to the first circuit board and disposed under the cover panel, a control chip mounted on a first surface of the second circuit board, an adhesive layer attaching the second circuit board to the cover panel and, when viewed in a plan view, defining a first opening exposing a portion of the second circuit board at which the control chip is disposed, and a cover tape covering each of the first circuit board, the second circuit board, and the control chip.

A second surface, opposite to the first surface, of the second circuit board contacts the adhesive layer.

The cover tape is electrically connected to the pad area, the first circuit board, and the second circuit board.

The cover tape includes metal.

The first circuit board includes a first part overlapping a part of the pad area, a second part having a curved shape extending around the cover panel and a first end connected to the first part, and a third part disposed under the cover panel and connected to a second end, opposite to the first end, of the second part.

The adhesive layer includes a first adhesive portion and a second adhesive portion. When viewed in a plan view, the opening is disposed between the first adhesive portion and the second adhesive portion. When viewed in a plan view, each of the first adhesive portion and the second adhesive portion is spaced apart from the control chip.

The adhesive layer defines a first passage area and a second passage area exposing a second surface, opposite to the first surface, of the second circuit board between the first adhesive portion and the second adhesive portion. The adhesive layer contacts the second surface of the second circuit board. When viewed in a plan view, the first passage area and the second passage area face each other with the control chip interposed therebetween.

The adhesive layer includes first, second, third, and fourth adhesive portions spaced apart from each other. When viewed in a plan view, each of the first, second, third, and fourth adhesive portions is spaced apart from the control chip.

The adhesive layer defines first, second, third, and fourth passage areas exposing a second surface, opposite to the first surface, of the second circuit board between the first adhesive portion and the second adhesive portion, between the second adhesive portion and the third adhesive portion, between the third adhesive portion and the fourth adhesive portion, and the fourth adhesive portion and the first adhesive portion, respectively. The adhesive layer contacts the second surface of the second circuit board. When viewed in a plan view, the first passage area and the third passage area face each other with the control chip interposed therebetween. When viewed in a plan view, the second passage area and the fourth passage area face each other with the control chip interposed therebetween.

The cover tape defines a second opening exposing a side surface of the second circuit board adjacent to the display area.

The display substrate includes a first part on which the plurality of pixels are disposed, a second part having a curved shape extending around the cover panel and a first end connected to the first part, and a third part disposed under the cover panel and connected to a second end, opposite to the first end, of the second part.

A display device according to an embodiment of the present disclosure includes a display substrate including a display area on which a plurality of pixels are disposed and a pad area adjacent to an one side of the display area, a cover panel disposed under the display substrate, a first circuit board electrically connected to the pad area, a second circuit board electrically connected to the first circuit board and disposed under the cover panel, wherein the first circuit board includes a first part overlapping a part of the pad area, a second part having a curved shape extending around the cover panel and a first end connected to the first part, and a third part disposed under the cover panel and connected to a second end, opposite to the first end, of the second part, a control chip mounted on a first surface of the second circuit board, an adhesive layer attaching the second circuit board to the cover panel and, when viewed in a plan view, defining a first opening exposing a portion of the second circuit board at which the control chip is disposed, and a cover tape covering the first circuit board, a portion of the second circuit board between the third part of the first circuit board and the control chip, and the control chip, wherein the cover tape and the cover panel are arranged such that a side surface of the adhesive layer and a side surface of the second circuit board are exposed to the external of the display device.

A display device according to an embodiment of the present disclosure may include a first circuit board, a second circuit board connected to the first circuit board, and an adhesive member attaching the second circuit board to a cover panel and defining a first opening area overlapping a control chip on a plane.

Here, the first opening area may exist between the second circuit board and the cover panel. Accordingly, heat generated from the control chip may flow into the first opening area. Due to the first opening area, heat transferred to a display substrate through the cover panel may be reduced.

A display device according to an embodiment of the present disclosure may further include a cover tape covering each of the first circuit board, the second circuit board, and the control chip and defining a second opening area exposing a side surface of the second circuit board adjacent to a display area.

Here, due to the second opening area defined by the cover tape, an air passage may be formed so that heat introduced into the first opening area is dissipated to the outside of the display device. Accordingly, transfer of heat generated from the control chip to the display substrate may be minimized.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
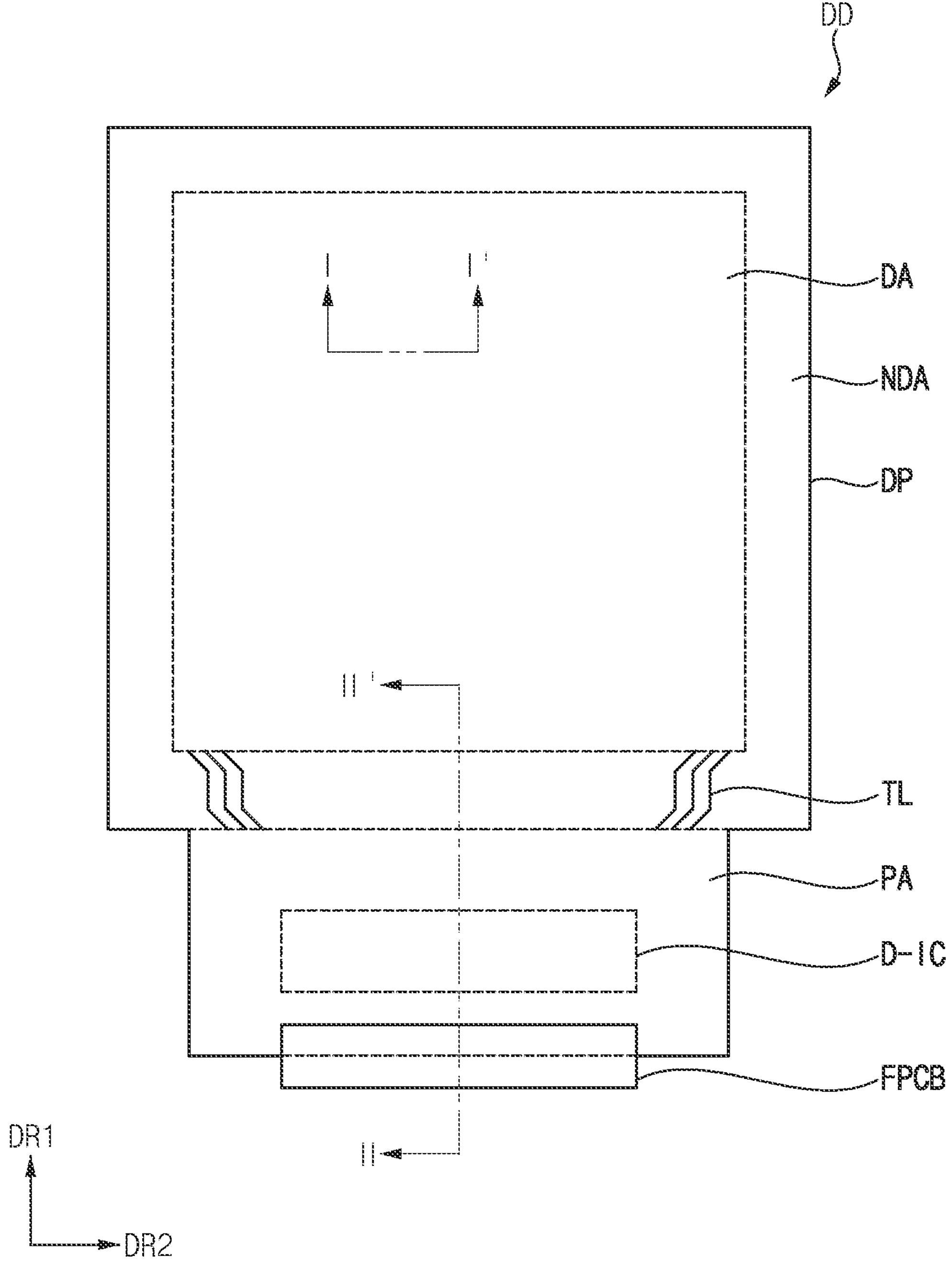
FIG. 1 is a plan view illustrating a display device according to an embodiment of the present disclosure.

Hereinafter, a display device according to embodiments of the present disclosure will be explained in detail with reference to the accompanying drawings. The same reference numerals are used for the same components in the drawings, and redundant descriptions of the same components will be omitted.

FIG. 1 is a plan view illustrating a display device according to an embodiment of the present disclosure.

Referring to FIG. 1, a display device DD according to an embodiment of the present disclosure may include a display panel DP, a first circuit board FPCB, and a driving chip D-IC.

The display panel DP may include a display area DA and a non-display area NDA. A plurality of pixels for generating an image may be disposed in the display area DA. The image may be generated by combining light emitted from each of the pixels. For example, the pixels may be arranged in a matrix form along a first direction DR1 and a second direction DR2.

The non-display area NDA may be positioned around the display area DA. For example, the non-display area NDA may surround the display area DA on a plane.

The non-display area NDA may include a pad area PA. The pad area PA may be positioned on one side of the display area DA. For example, the pad area PA may be spaced apart from the display area DA in the first direction DR1. The pad area PA may extend in the second direction DR2. A plurality of pads may be disposed in the pad area PA.

The display panel DP may include a plurality of transfer lines TL connecting the display area DA to the pad area PA. The transfer lines TL may be positioned between the display area DA and the pad area PA. Each of the transfer lines TL may include a first end adjacent to the pad area PA and a second end adjacent to the display area DA. The first end of each of the transfer lines TL may be connected to a corresponding pad among the pads. The second end of each of the transfer lines TL may be connected to a corresponding line among a plurality of lines (e.g., gate lines, data lines, or driving voltage lines) disposed in the display area DA. The pads and the pixels may be electrically connected with each other through the transfer lines TL.

The driving chip D-IC may be disposed on the pad area PA of the display panel DP. The driving chip D-IC may include a plurality of bumps connected to the pads.

The first circuit board FPCB may be disposed on the pad area PA of the display panel DP. Specifically, a first end of the first circuit board FPCB may be attached to the display panel DP and overlap a part of the pad area PA. The first circuit board FPCB may be electrically connected to the pad area PA. For example, the first circuit board FPCB may be a flexible printed circuit board.

A second circuit board (e.g., a second circuit board MPCB of FIG. 3) may be attached to a second end opposite to the first end of the first circuit board FPCB. For example, the second circuit board may be a printed circuit board.

The driving chip D-IC, the first circuit board FPCB, and the second circuit board may provide a driving signal to the display panel DP. The driving signal may include various signals for driving the display panel DP, such as a driving voltage, a control signal, and a data signal. The driving signal may be transferred to the pixels disposed in the display area DA through the pads and the transfer lines TL.

In this specification, a plane may be defined as the first direction DR1 and the second direction DR2 crossing the first direction DR1. For example, the first direction DR1 and the second direction DR2 may be perpendicular to each other. In an embodiment, the first direction DR1 and the second direction DR2 may be parallel to an upper surface of the substrate SUB.

Figure 2:
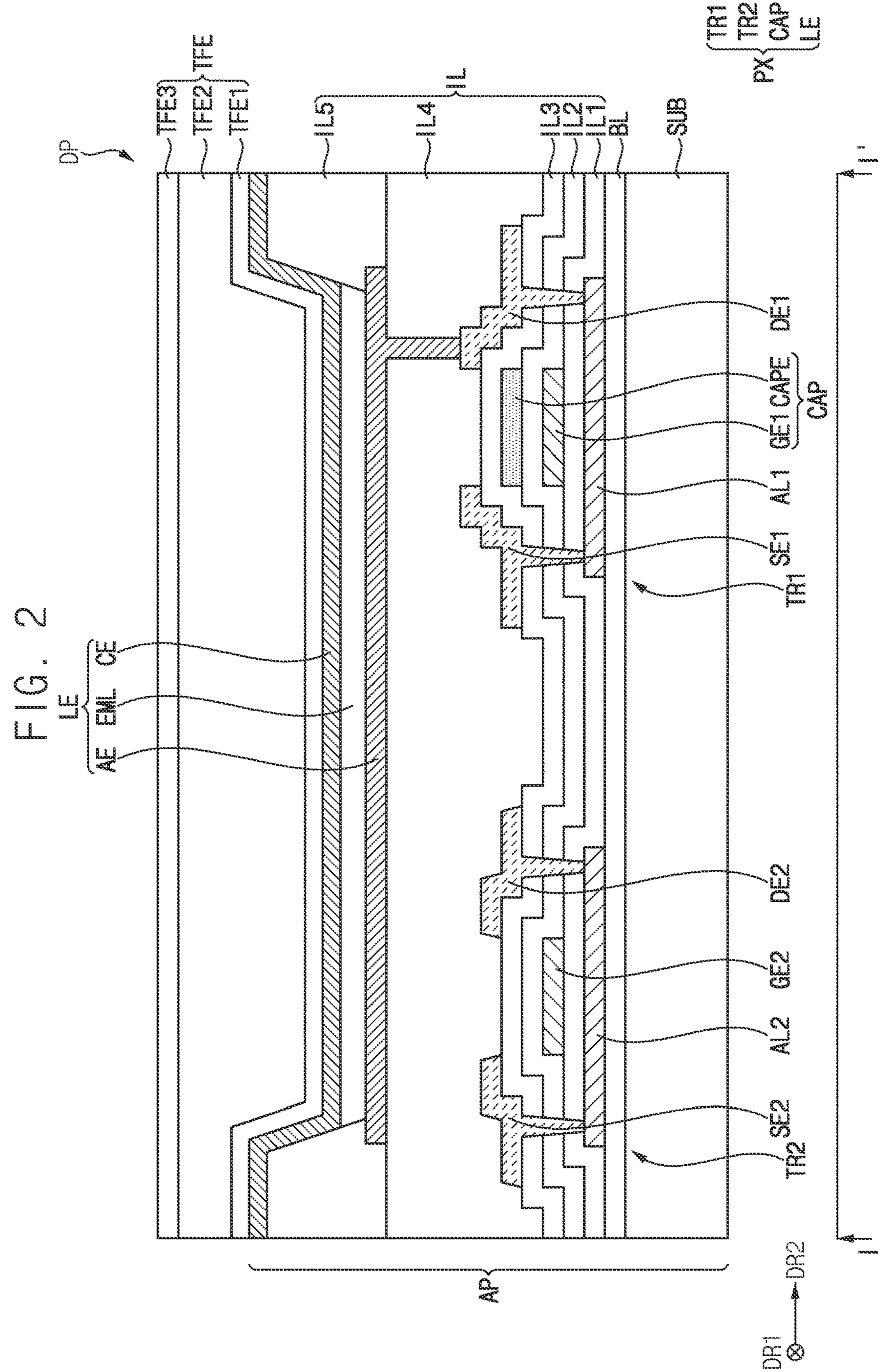
FIG. 2 is a cross-sectional view taken along line I-I' of FIG. 1.

FIG. 2 is a cross-sectional view taken along line I-I' of FIG. 1. Hereinafter, a cross-sectional structure of the display area DA of the display panel DP will be described in detail with reference to FIGS. 1 and 2.

Referring to FIGS. 1 and 2, the display panel DP may include a display substrate AP and an encapsulation layer TFE. The display substrate AP may include a substrate SUB, a buffer layer BL, an insulating layer IL, and a pixel PX. The insulating layer IL may include first to fifth insulating layers IL1, IL2, IL3, IL4, and IL5. The pixel PX may include a first transistor TR1, a second transistor TR2, a capacitor CAP, and a light emitting element LE. The capacitor CAP may include a first gate electrode GE1 and a capacitor electrode CAPE. The light emitting element LE may include an anode electrode AE, a light emitting layer EML, and a cathode electrode CE.

The substrate SUB may include or may be formed of a transparent material or an opaque material. The substrate SUB may include or may be formed of a transparent resin substrate. A polyimide substrate may be mentioned as an example of the transparent resin substrate. In this case, the polyimide substrate may include a first organic layer, a first barrier layer, or a second organic layer. Alternatively, the substrate SUB may include or may be a quartz substrate, a synthetic quartz substrate, a calcium fluoride substrate, an F-doped quartz substrate, a soda lime glass substrate, or a non-alkali glass substrate. These may be used alone or in combination with each other.

The buffer layer BL may be disposed on the substrate SUB. The buffer layer BL may prevent impurities such as oxygen and moisture from diffusing into functional elements (e.g., the light emitting element LE) that are disposed on the substrate SUB. For example, the buffer layer BL may block such impurities that penetrate the substrate SUB from diffusing into the elements that are disposed on the substrate SUB. The buffer layer BL may include or may be formed of an inorganic insulating material such as a silicon compound and a metal oxide. Examples of the inorganic insulating material that may be used for the buffer layer BL may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), or titanium oxide (TiO). These may be used alone or in combination with each other. The buffer layer BL may have a single-layer structure or a multi-layer structure including a plurality of insulating layers.

The first transistor TR1, the second transistor TR2, and a capacitor CAP may be disposed on the buffer layer BL. The first transistor TR1 may include a first active layer AL1, the first gate electrode GE1, a first source electrode SE1, and a first drain electrode DE1. The first transistor TR1 may be referred to as a driving transistor connected to the light emitting element LE. The second transistor TR2 may include a second active layer AL2, a second gate electrode GE2, a second source electrode SE2, and a second drain electrode DE2. The second transistor TR2 may be referred to as a switching transistor connected to a data line.

The active layers AL1 and AL2 may be disposed on the buffer layer BL. Each of the active layers AL1 and AL2 may include or may be formed of an oxide semiconductor, a silicon semiconductor, or an organic semiconductor. For example, the oxide semiconductor may include indium (In), gallium (Ga), tin (Sn), zirconium (Zr), vanadium (V), hafnium (Hf), cadmium (Cd), germanium (Ge), chromium (Cr), titanium (Ti), or zinc (Zn). These may be used alone or in combination with each other. The silicon semiconductor may include or may be formed of amorphous silicon or polycrystalline silicon. Each of the active layers AL1 and AL2 may include a source area, a drain area, and a channel area positioned between the source area and the drain area.

The first insulating layer IL1 may be disposed on the active layers AL1 and AL2. The first insulating layer IL1 may cover the active layers AL1 and AL2 on the buffer layer BL. The first insulating layer IL1 may include or may be formed of an inorganic insulating material.

The gate electrodes GE1 and GE2 may be disposed on the first insulating layer IL1. The first gate electrode GE1 may overlap the channel area of the first active layer AL1 and the second gate electrode GE2 may overlap the channel area of the second active layer AL2. Each of the gate electrodes GE1 and GE2 may include or may be formed of a conductive material such as metal, an alloy, a conductive metal nitride, a conductive metal oxide, and a transparent conductive material. Examples of the conductive material that may be used for each of the gate electrodes GE1 and GE2 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy containing aluminum, alloy containing silver, an alloy containing copper, an alloy containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), or indium zinc oxide (IZO). These may be used alone or in combination with each other. Each of the gate electrodes GE1 and GE2 may have a single-layer structure or a multi-layer structure including a plurality of conductive layers.

The second insulating layer IL2 may be disposed on the gate electrodes GE1 and GE2. The second insulating layer IL2 may cover the gate electrodes GE1 and GE2 on the first insulating layer IL1. The second insulating layer IL2 may include or may be formed of an inorganic insulating material.

The capacitor electrode CAPE may be disposed on the second insulating layer IL2. The capacitor electrode CAPE may overlap the first gate electrode GE1. The first gate electrode GE1, the second insulating layer IL2, and the capacitor electrode CAPE may form the capacitor CAP.

The third insulating layer IL3 may be disposed on the capacitor electrode CAPE. The third insulating layer IL3 may cover the capacitor electrode CAPE on the second insulating layer IL2. The third insulating layer IL3 may include or may be formed of an inorganic insulating material.

The source electrodes SE1 and SE2 and the drain electrodes DE1 and DE2 may be disposed on the third insulating layer IL3. The first source electrode SE1 and the first drain electrode DE1 may be connected to the source area and the drain area of the first active layer AL1, respectively. The second source electrode SE1 and the second drain electrode DE2 may be connected to the source area and the drain area of the second active layer AL2, respectively. Each of the source electrodes SE1 and SE2 and the drain electrodes DE1 and DE2 may include or may be formed of a conductive material.

The fourth insulating layer IL4 may be disposed on the source electrodes SE1 and SE2 and the drain electrodes DE1 and DE2. The fourth insulating layer IL4 may include or may be formed of an organic insulating material. Examples of the organic insulating material that may be used for the fourth insulating layer IL4 may include photoresist, polyacryl-based resin, polyimide-based resin, polyamide-based resin, siloxane-based resin, acryl-based resin, or epoxy-based resin. These may be used alone or in combination with each other.

The anode electrode AE may be disposed on the fourth insulating layer IL4. The anode electrode AE may include or may be formed of a conductive material. The anode electrode AE may be connected to the first drain electrode DE1 through a contact hole formed in the fourth insulating layer IL4. Accordingly, the anode electrode AE may be electrically connected to the first transistor TR1.

The fifth insulating layer IL5 may be disposed on the anode electrode AE. The fifth insulating layer IL5 may define a pixel opening that covers a periphery part of the anode electrode AE and exposes a central part of the anode electrode AE. The fifth insulating layer IL5 may include or may be formed of an organic insulating material.

The light emitting layer EML may be disposed on the anode electrode AE. The light emitting layer EML may be disposed in the pixel opening of the fifth insulating layer IL5. The light emitting layer EML may include at least one of an organic light emitting material and quantum dots.

In an embodiment, the organic light emitting material may include a low molecular weight organic compound or a high molecular weight organic compound. Examples of the low molecular weight organic compound may include copper phthalocyanine, N,N'-diphenylbenzidine, or tri-(8-hydroxyquinoline)aluminum. Examples of the high molecular weight organic compound may include poly(3,4-ethylenedioxythiophene), polyaniline, poly-phenylenevinylene, or polyfluorene. These may be used alone or in combination with each other.

The cathode electrode CE may be disposed on the light emitting layer EML. The cathode electrode CE may be disposed on the fifth insulating layer IL5. The cathode electrode CE may include or may be formed of a conductive material. The anode electrode AE, the light emitting layer EML, and the cathode electrode CE may form the light emitting element LE.

The encapsulation layer TFE may be disposed on the cathode electrode CE. The encapsulation layer TFE may prevent impurities, moisture, and the like from permeating the light emitting element LE from the outside. The encapsulation layer TFE may include or may be formed of at least one inorganic encapsulation layer and at least one organic encapsulation layer. For example, the inorganic encapsulation layer may include or may be formed of silicon oxide, silicon nitride, or silicon oxynitride. The organic encapsulation layer may include or may be formed of a polymer cured material such as polyacrylate. In an embodiment, the encapsulation layer TFE may include or may be formed of a first inorganic encapsulation layer TFE1 disposed on the cathode electrode CE, an organic encapsulation layer TFE2 disposed on the first inorganic encapsulation layer TFE1, and a second inorganic encapsulation layer TFE3 disposed on the organic encapsulation layer TFE2.

The display device DD of the present disclosure may be the organic light emitting display device ("OLED"). The configuration of the present disclosure, however, is not limited thereto. In some embodiments, the display device DD may be a liquid crystal display device ("LCD"), a field emission display device ("FED"), a plasma display device ("PDP"), an electrophoretic display device ("EPD"), an inorganic light emitting display device ("ILED"), or a quantum dot display device.

Figure 3:
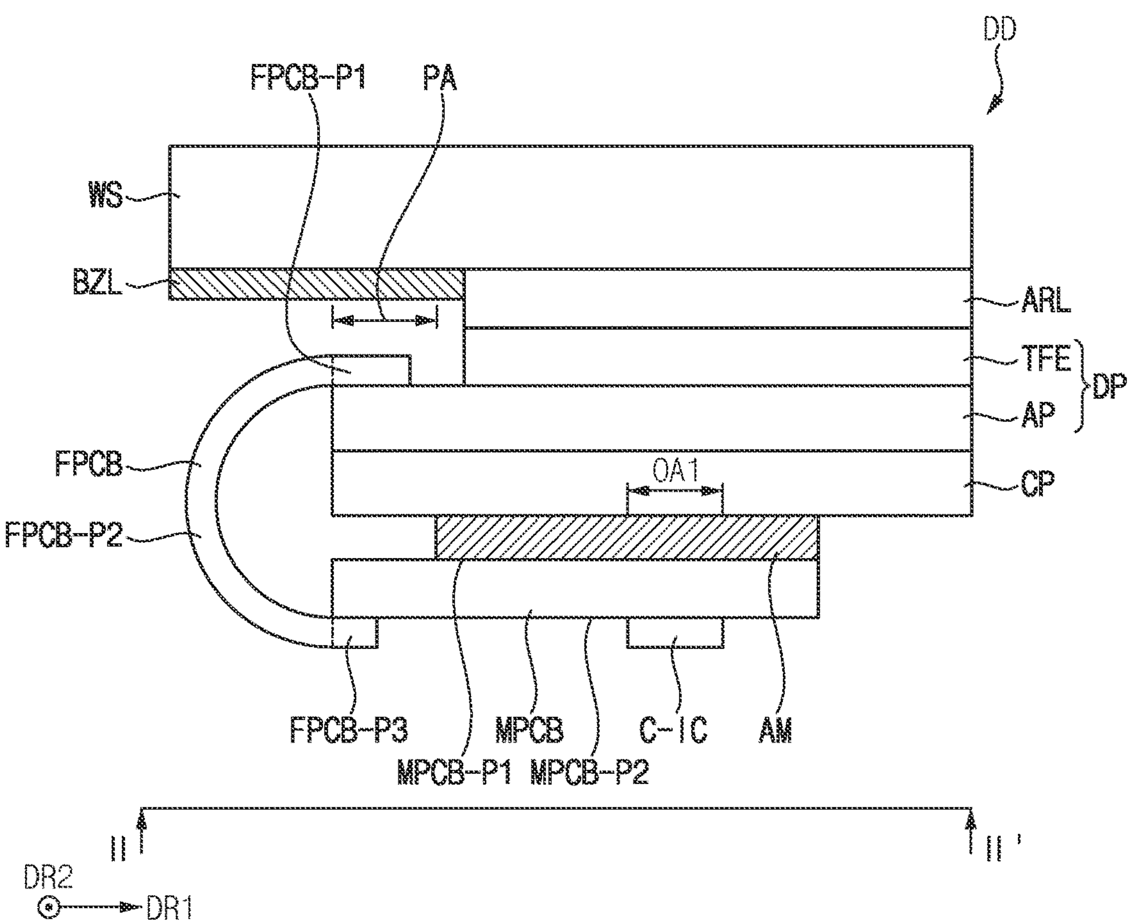
FIG. 3 is a cross-sectional view taken along line II-II' of FIG. 1.
Figure 4:
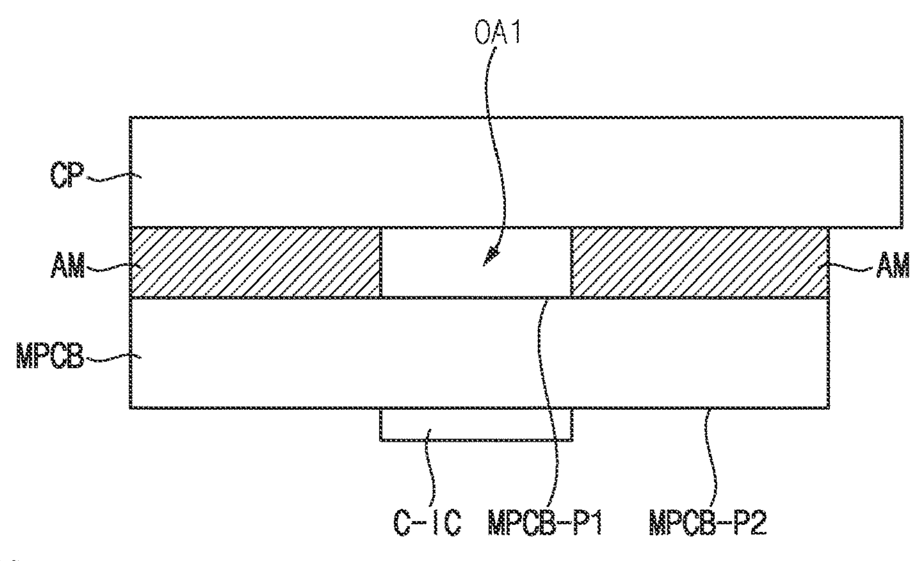
FIG. 4 is an enlarged cross-sectional view of a part of the display device according to an embodiment.

FIG. 3 is a cross-sectional view taken along line II-II' of FIG. 1. FIG. 4 is an enlarged cross-sectional view of a part of the display device according to an embodiment. For example, FIG. 4 is an enlarged cross-sectional view of a part where a second circuit board MPCB of the display device DD of FIG. 3 is attached to a cover panel CP by an adhesive member AM.

Referring to FIG. 3, the display device DD according to an embodiment of the present disclosure may include a window substrate WS, a bezel layer BZL, an anti-reflection member ARL (i.e., an anti-reflection layer), the display panel DP, a cover panel CP, the first circuit board FPCB, a second circuit board MPCB, a control chip C-IC, and an adhesive member AM (i.e., an adhesive layer). The display panel DP may include the encapsulation layer TFE and the display substrate AP.

The window substrate WS may include or may be a glass substrate, a sapphire substrate, or a plastic substrate. The window substrate WS may have a single-layer structure or a multi-layer structure. For example, the window substrate WS may include or may be formed of a plurality of plastic films attached together with an adhesive.

The bezel layer BZL may have a single-layer structure or a multi-layer structure. For example, when the bezel layer BZL has the multi-layer structure, the bezel layer BZL may include a buffer layer improving adhesion, a pattern layer providing a predetermined pattern, and an achromatic layer. The achromatic layer may include an inorganic material and/or an organic material including a light block material with black color. For example, the light blocking material may include black pigment, black dye, or carbon black. These may be used alone or in combination with each other.

The anti-reflection member ARL may include a polarizer and a phase retarder. The anti-reflection member ARL may include a polarizer and/or a phase retarder of a stretchable film type. The number of the phase retarder and the phase delay length ($\lambda/4$ or $\lambda/2$) of the phase retarder may be determined according to the operating principle of the anti-reflection member ARL. Alternatively, the anti-reflection member ARL may include color filters and a black matrix.

As described above, the display panel DP may include the display substrate AP and the encapsulation layer TFE. Here, the display substrate AP may include the substrate, the buffer layer, the insulating layer, and the pixel. In an embodiment, the display substrate AP may be a display substrate including a rigid substrate. In an embodiment, the display substrate AP may include a flexible substrate. Embodiments in which the display substrate AP includes the flexible substrate will be described later with reference to FIGS. 8, 10, and 12.

The first circuit board FPCB may include or may be formed of at least one insulating layer and at least one conductive layer. The conductive layer of the first circuit board FPCB may be connected to the pads of the display panel DP through an anisotropic conductive film ("ACF").

The first circuit board FPCB may be disposed on the display substrate AP and may overlap a part of the pad area PA. The first circuit board FPCB may be bent under the display substrate AP to be connected to the second circuit board MPCB. Specifically, the first circuit board FPCB may include a first part FPCB-P1 overlapping the part of the pad area PA, a second part FPCB-P2 extending from the first part FPCB-P1 and having a curvature value, and a third part FPCB-P3 extending from the second part FPCB-P2 and disposed under the cover panel CP. In an embodiment, the first circuit board FPCB may include the first part FPCB-P1 overlapping the part of the pad area PA, the second part FPCB-P2 having a curved shape extending around the cover panel CP and a first end connected to the first part FPCB-P1, and the third part FPCB-P3 disposed under the cover panel CP and connected to a second end, opposite to the first end, of the second part FPCB-P2.

The second circuit board MPCB may be disposed on the third part FPCB-P3 of the first circuit board FPCB. The second circuit board MPCB may include or may be formed of at least one insulating layer and at least one conductive layer. The conductive layer of the second circuit board MPCB may be connected to the conductive layer of the first circuit board FPCB through an anisotropic conductive film.

The control chip C-IC may be mounted on one surface of the second circuit board MPCB. In an embodiment, the control chip C-IC may be mounted on a second surface MPCB-P2 of the second circuit board MPCB that is opposite to a first surface MPCB-P1 of the second circuit board MPCB. The first surface MPCB-P1 may contact the adhesive member AM. The control chip C-IC may provide various signals and voltages to the display panel DP.

The cover panel CP may be disposed under the display substrate AP. The cover panel CP may protect the display panel DP from impact. The cover panel CP may be electrically connected to the second circuit board MPCB. The cover panel CP may include or may be formed of metal to dissipate heat. For example, the cover panel CP may include or may be formed of metal such as aluminum (Al) and copper (Cu). These may be used alone or in combination with each other.

Referring to FIGS. 3 and 4, the second circuit board MPCB may be attached to the cover panel CP by the adhesive member AM. The adhesive member AM may be a transparent adhesive material such as a pressure sensitive adhesive film ("PSA film"), an optically clear adhesive film ("OCA film"), or an optically clear resin ("OCR"). The adhesive member AM may include an adhesive sheet of which opposite sides have adhesive properties. In an embodiment, the adhesive member AM may have double-sided adhesive characteristics capable of attaching and fixing structures positioned on a upper part (i.e., an upper surface) of the adhesive member AM and a lower part (i.e., a lower surface) of the adhesive member AM.

When the display device DD is driven, a lot of heat may be generated in the control chip C-IC. When heat generated from the control chip C-IC is transferred to the display substrate AP, characteristic of the transistor included in the pixel of the display substrate AP may change, and lifetime of the light emitting element included in the pixel of the display substrate AP may be reduced.

To minimize the transfer of the heat generated by the control chip C-IC to the display substrate AP, an opening area OA1 (i.e., an opening) may be defined in the adhesive member AM, and the opening may expose a portion of the second circuit board MPCB at which the control chip C-IC is disposed. The control chip C-IC is attached to the adhesive member AM while maintaining a space between the second circuit board MPCB and the cover panel CP. That is, the opening area OA1 may be positioned between the second circuit board MPCB and the cover panel CP.

Accordingly, heat generated from the control chip C-IC may flow into the opening area OA1. The opening area OA1 may reduce an amount of heat transferred to the display substrate AP through the cover panel CP. As a result, problems such as a change in characteristic of the transistor and a decrease in lifespan of the light emitting element, which may occur when heat generated from the control chip C-IC is transferred to the display substrate AP, may be solved or mitigated.

Figure 5:
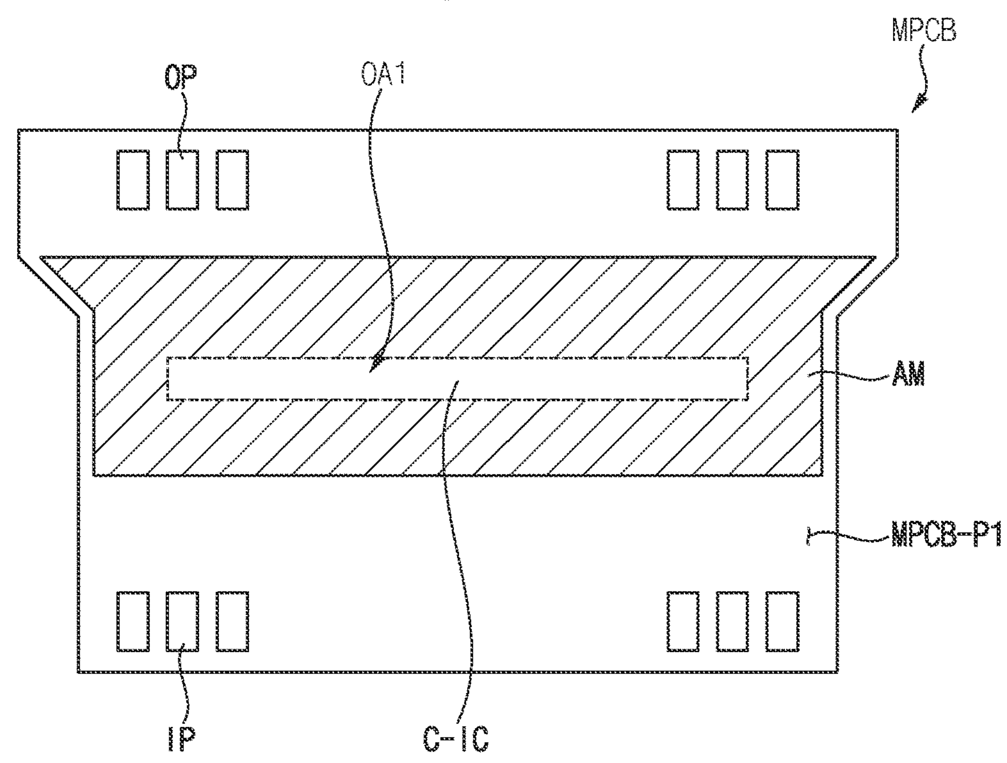
FIGS. 5, 6, and 7 are plan views of a second circuit board according to embodiments of the present disclosure.
Figure 6:
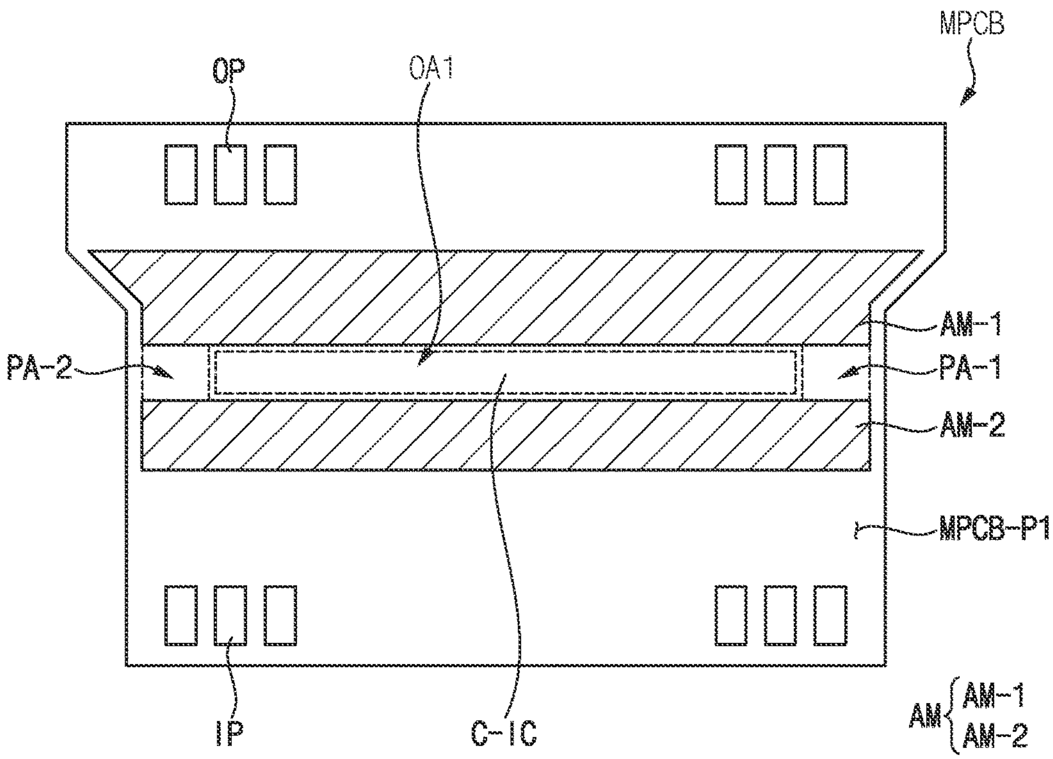
Figure 7:
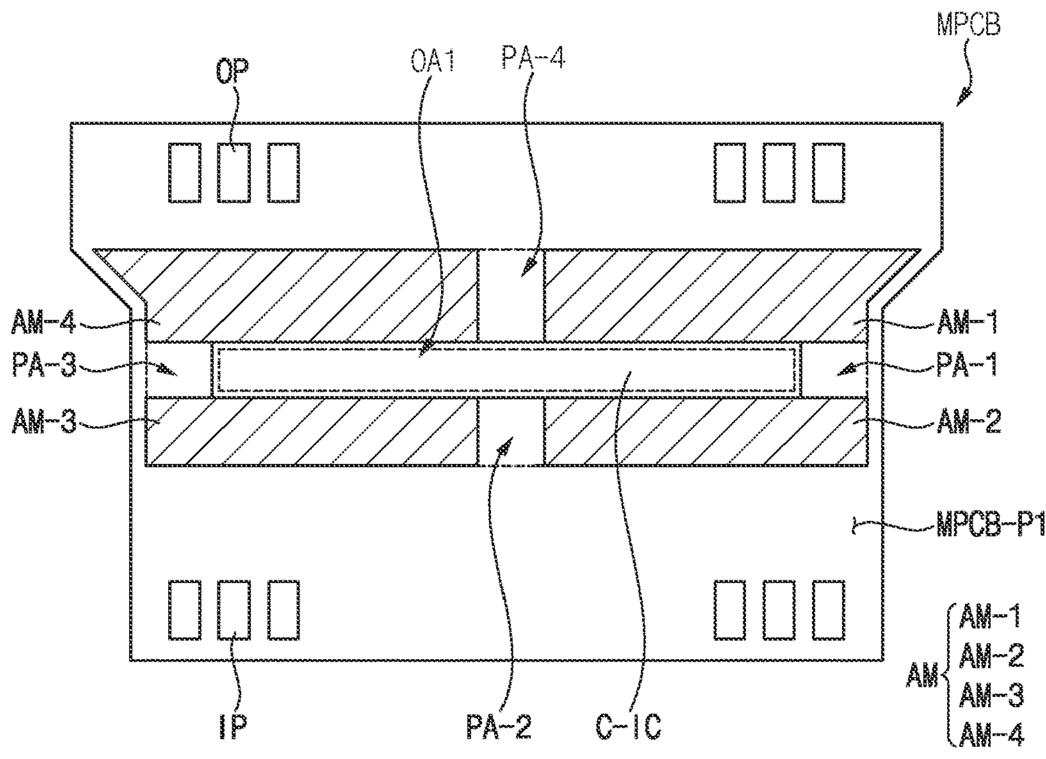

FIGS. 5, 6, and 7 are plan views of a second circuit board according to embodiments of the present disclosure. For example, FIGS. 5, 6, and 7 illustrate the second circuit boards MPCB in an unfolded state (i.e., in a state where the second circuit boards MPCB are disassembled from the display device DD). In FIGS. 5, 6, and 7, the opening OA1 may be larger than the control chip C-IC in area when viewed in a plan view. For example, when viewed in a plan view, an outer boundary of the control chip C-IC may be surrounded by the perimeter of the opening area OA1 (i.e., the opening), and the control chip C-IC may be spaced apart from the perimeter of the opening OA1.

Referring to FIGS. 5, 6, and 7, an input pad IP and an output pad OP may be disposed on one surface of the second circuit board MPCB. When the second circuit board is connected to the first circuit board (e.g., the first circuit board FPCB of FIG. 3), the input pad IP and the output pad OP may be disposed on the second surface MPCB-P2 of the second circuit board MPCB that is opposite to the first surface MPCB-P1 of the second circuit board MPCB facing the display panel (e.g., the display panel DP of FIG. 3). In this case, the output pad OP of the second circuit board MPCB may be connected to the first circuit board. The adhesive member AM may be disposed on the first surface MPCB-P1 of the second circuit board MPCB to have a shape surrounding the control chip C-IC on a plane (i.e., when viewed in a plan view).

Referring to FIG. 6, in an embodiment, the adhesive member AM may include a first adhesive portion AM-1 and a second adhesive portion AM-2 spaced apart from each other, and each of the first adhesive portion AM-1 and the second adhesive portion AM-2 may be spaced apart from the control chip C-IC on a plane (i.e., when viewed in a plan view). For example, each of the first adhesive portion AM-1 and the second adhesive portion AM-2 may be spaced apart from an outer boundary of the control chip C-IC when viewed in a plan view. Specifically, the adhesive member AM may define a first passage area PA-I and a second passage area PA-2, exposing the first surface MPCB-P1 of the second circuit board MPCB between the first adhesive portion AM-1 and the second adhesive portion AM-2. The first passage area PA-I and the second passage area PA-2 may face each other with the control chip C-IC interposed therebetween. In this case, the first passage area PA-I and the second passage area PA-2 may be defined as areas where the adhesive member AM is not disposed.

Referring to FIG. 7, in an embodiment, the adhesive member AM may include first, second, third, and fourth adhesive portions AM-1, AM-2, AM-3, and AM-4 spaced apart from each other, and each of the first, second, third, and fourth adhesive portions AM-1, AM-2, AM-3, and AM-4 may be spaced apart from the control chip C-IC on a plane. Specifically, the adhesive member AM may define first, second, third, and fourth passage areas PA-1, PA-2, PA-3, and PA-4, exposing the first surface MPCB-P1 of the second circuit board MPCB between the first, second, third, and fourth adhesive portions AM-1, AM-2, AM-3, and AM-4. The first passage area PA-1 and the third passage area PA-3 may face each other with the control chip C-IC interposed therebetween, and the second passage area PA-2 and the fourth passage area PA-4 may face each other with the control chip C-IC interposed therebetween. In this case, the first passage area PA-1, the second passage area PA-2, the third passage area PA-3, and the fourth passage area PA-4 may be defined as areas where the adhesive member AM is not disposed.

However, embodiments of the present disclosure are not limited thereto. For example, the adhesive member AM may be disposed to have various shapes spaced apart from the control chip C-IC on a plane.

When the area of a region where the adhesive member AM is disposed on the first surface MPCB-P1 of the second circuit board MPCB decreases, the bonding strength between the second circuit board MPCB and the cover panel (e.g., the cover panel CP of FIG. 3) may decrease. When pressure is applied to a region where the adhesive member AM is not disposed on the first surface MPCB-P1 of the second circuit board MPCB, cracks may occur in the second circuit board MPCB. Accordingly, a shape in which the adhesive member AM is disposed on the second circuit board MPCB may be determined in consideration of these factors.

Figure 8:
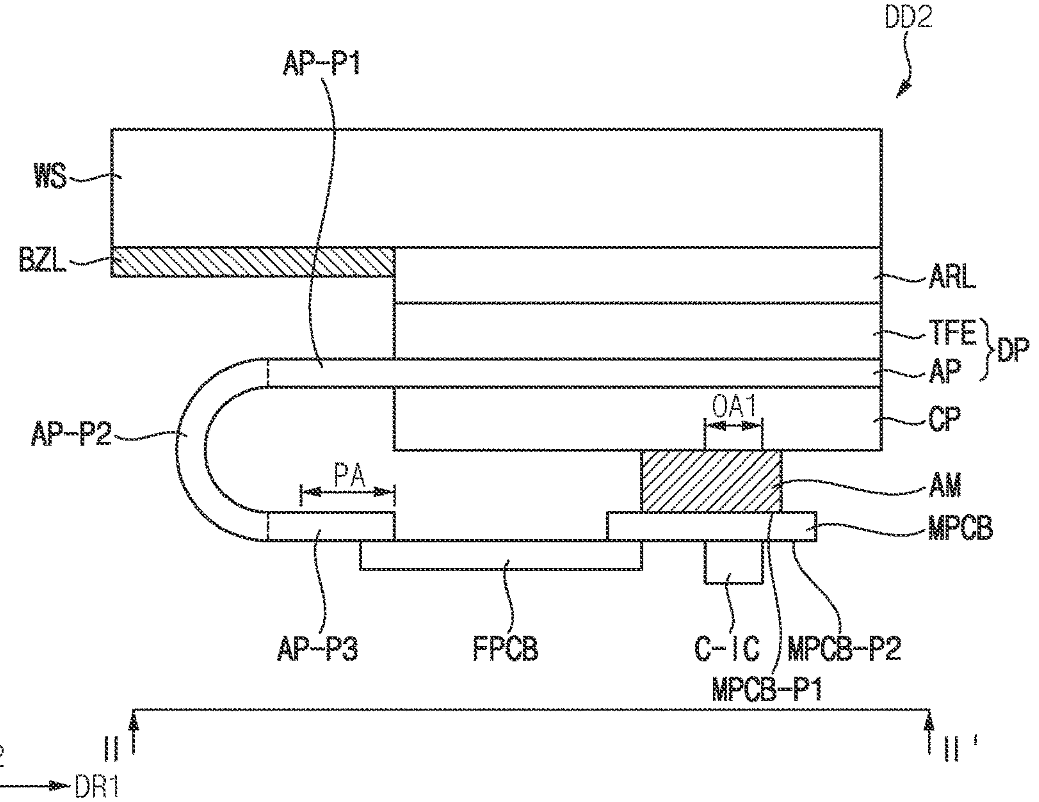
FIG. 8 is a cross-sectional view illustrating a display device according to an embodiment of the present disclosure.

FIG. 8 is a cross-sectional view illustrating a display device according to an embodiment of the present disclosure. For example, FIG. 8 is a cross-sectional view illustrating an embodiment including a flexible substrate. Hereinafter, descriptions overlapping descriptions of the display device DD described with reference to FIG. 3 will be omitted or simplified.

Referring to FIG. 8, unlike the display device DD as illustrated in FIG. 3, a display substrate AP of a display device DD2 may include a curved surface. Compared with the display panel DP of FIG. 3, the display panel DP of FIG. 8 may include a substrate which is flexible and a thin film encapsulation layer TFE. The substrate may include or may be formed of a synthetic resin film such as polyimide and polyamide. The thin film encapsulation layer TFE may include or may be formed of an organic thin film and an inorganic thin film.

A part of the display substrate AP may be bent. Specifically, as the part of the display substrate AP is bent, the display substrate AP may include a first part AP-P1 on which the pixels are disposed, a second part AP-P2 extending from the first part AP-P1 and having a predetermined curvature value in a bent state, and a third part AP-P3 extending from the second part AP-P2 and disposed under the cover panel CP. The first circuit board FPCB may overlap a part of the pad area PA disposed in the third part AP-P3 of the display substrate AP. In an embodiment, the display substrate DD2 may include the first part AP-P1 on which the plurality of pixels are disposed, the second part AP-P2 having a curved shape extending around the cover panel CP and a first end connected to the first part AP-P1, and the third part AP-P3 disposed under the cover panel CP and connected to a second end, opposite to the first end, of the second part AP-P2.

The adhesive member AM illustrated in FIG. 8 may correspond to any one of the adhesive members AM illustrated in FIGS. 5, 6, and 7.

Figures 9, 10:
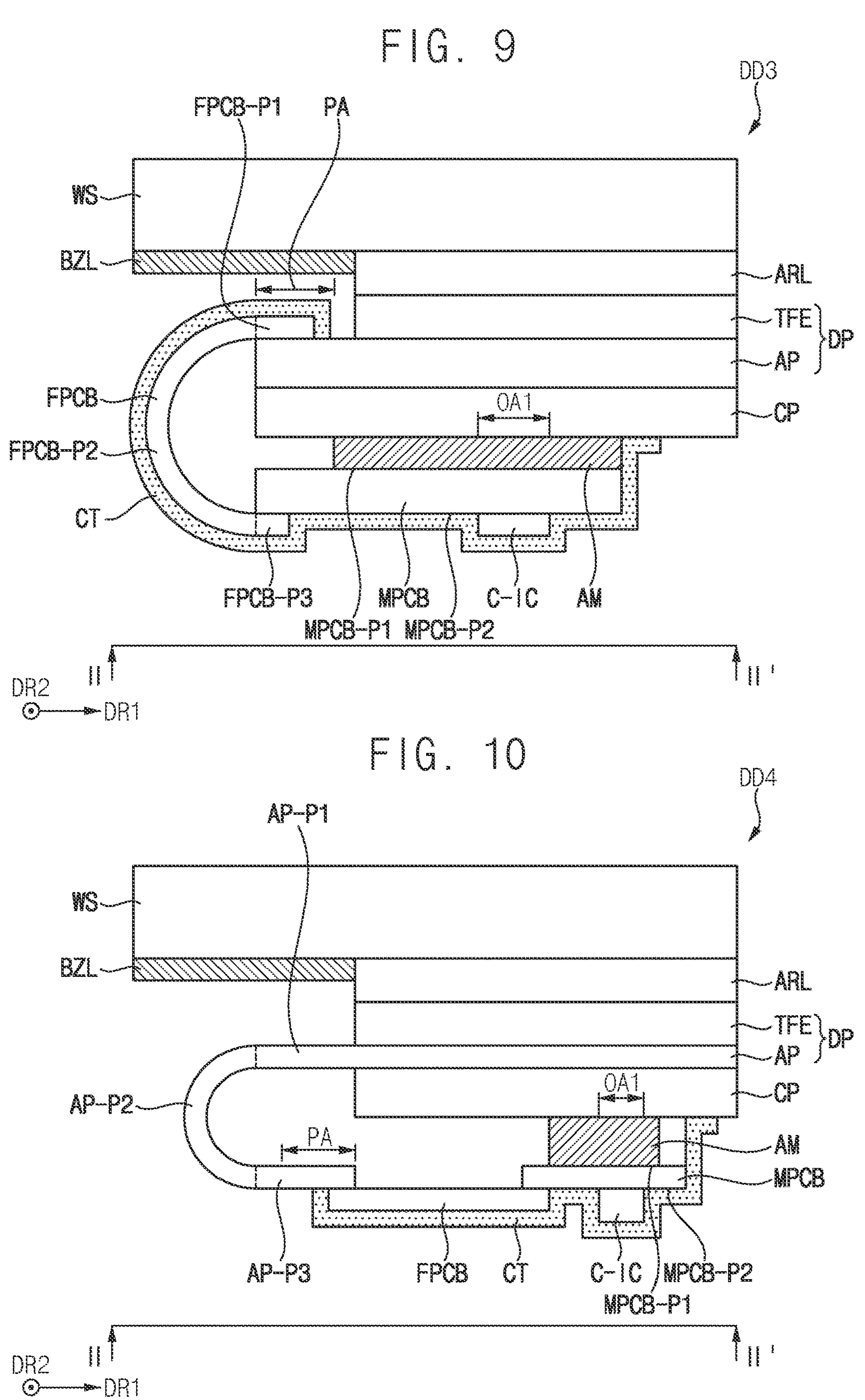
FIG. 9 is a cross-sectional view illustrating a display device according to an embodiment of the present disclosure.
FIG. 10 is a cross-sectional view illustrating a display device according to an embodiment of the present disclosure.

FIG. 9 is a cross-sectional view illustrating a display device according to an embodiment of the present disclosure. Hereinafter, descriptions overlapping descriptions of the display device DD described with reference to FIG. 3 will be omitted or simplified.

Referring to FIG. 9, a display device DD3 according to an embodiment of the present disclosure may include the window substrate WS, the bezel layer BZL, the anti-reflection member ARL (i.e., an anti-reflection layer), the display panel DP, the cover panel CP, the first circuit board FPCB, the second circuit board MPCB, the control chip C-IC, and a cover tape CT.

The cover tape CT may cover each of the first circuit board FPCB, the second circuit board MPCB, and the control chip C-IC. The cover tape CT may protect the first circuit board FPCB, the second circuit board MPCB, and the control chip C-IC from external impact. The cover tape CT may overlap a part of the pad area PA and may be electrically connected to the pad area PA, the first circuit board FPCB, and the second circuit board MPCB. The cover tape CT may cover a side surface of the adhesive member AM and a side surface of the second circuit board MPCB. In an embodiment, the cover tape CT may contact the side surface of the adhesive member AM and the side surface of the second circuit board MPCB. The side surface of the adhesive member AM and the side surface of the second circuit board MPCB may be vertically aligned with each other. The cover tape CT may include or may be formed of metal so that heat generated from the control chip C-IC is dissipated. For example, the metal material may include aluminum or copper. These may be used alone or in combination with each other.

The adhesive member AM illustrated in FIG. 9 may correspond to any one of the adhesive members AM illustrated in FIGS. 5, 6, and 7.

FIG. 10 is a cross-sectional view illustrating a display device according to an embodiment of the present disclosure. For example, FIG. 10 is a cross-sectional view illustrating an embodiment including a flexible substrate. Hereinafter, descriptions overlapping descriptions of the display device DD3 described with reference to FIG. 9 will be omitted or simplified.

Referring to FIG. 10, unlike the display device DD3 of FIG. 9, a display substrate AP of a display device DD4 may include a curved surface. That is, a part of the display substrate AP may be bent. Specifically, as the part of the display substrate AP is bent, the display substrate AP may include a first part AP-P1 on which the pixels are disposed, a second part AP-P2 extending from the first part AP-P1 and having a predetermined curvature value in a bent state, and a third part AP-P3 extending from the second part AP-P2 and disposed under the cover panel CP. The first circuit board FPCB may overlap a part of the pad area PA disposed in the third part AP-P3 of the display substrate AP. In an embodiment, the display substrate AP may include the first part AP-P1 on which the plurality of pixels are disposed, the second part AP-P2 having a curved shape extending around the cover panel CP and a first end connected to the first part AP-P1, and the third part AP-P3 disposed under the cover panel CP and connected to a second end, opposite to the first end, of the second part AP-P2. The second circuit board MPCB and the third part AP-P3 of the display substrate AP may be positioned at the same height. The first circuit board FPCB may contact a bottom surface (i.e., a first surface) of the second circuit board MPCB and a bottom surface of the third part AP-P3. The cover tape CT may cover the first circuit board FPCB and the control chip C-IC.

The adhesive member AM illustrated in FIG. 10 may correspond to any one of the adhesive members AM illustrated in FIGS. 5, 6, and 7.

Figure 11A:
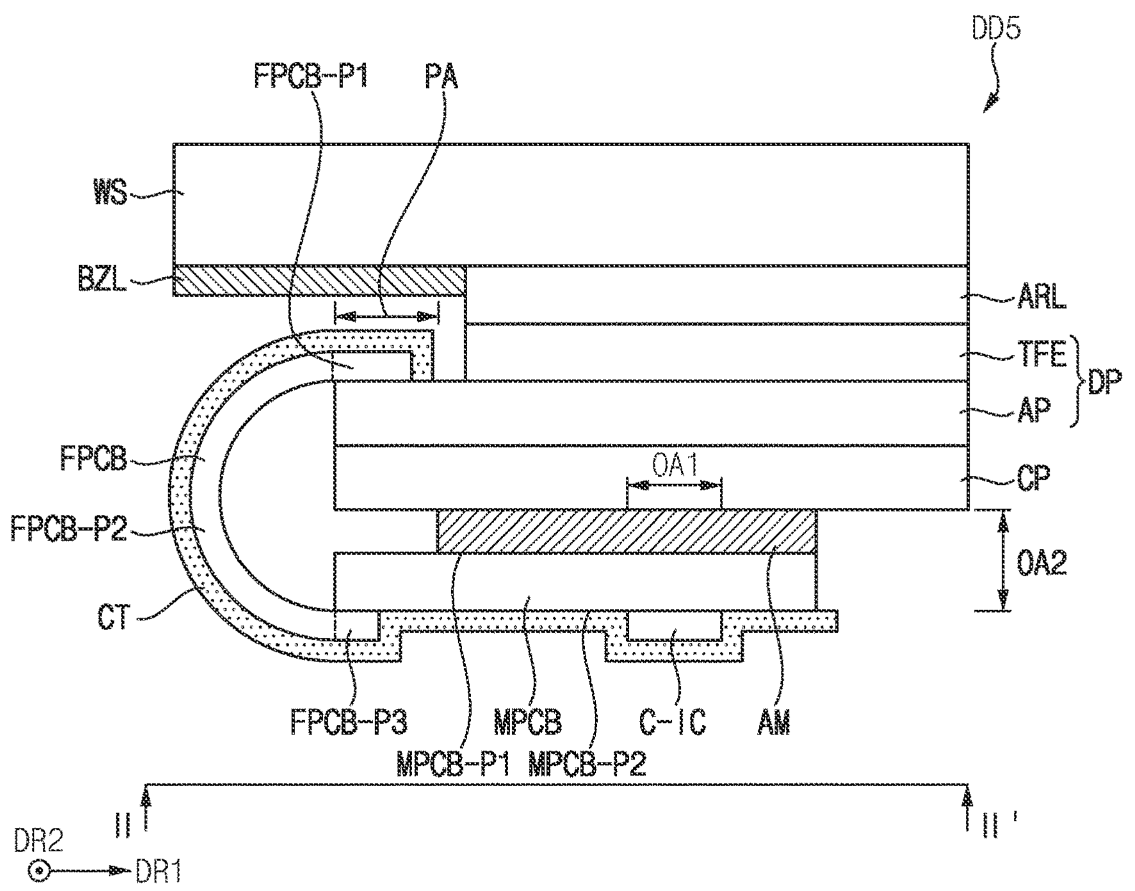
FIG. 11A is a cross-sectional view illustrating a display device according to an embodiment of the present disclosure.
Figure 11B:
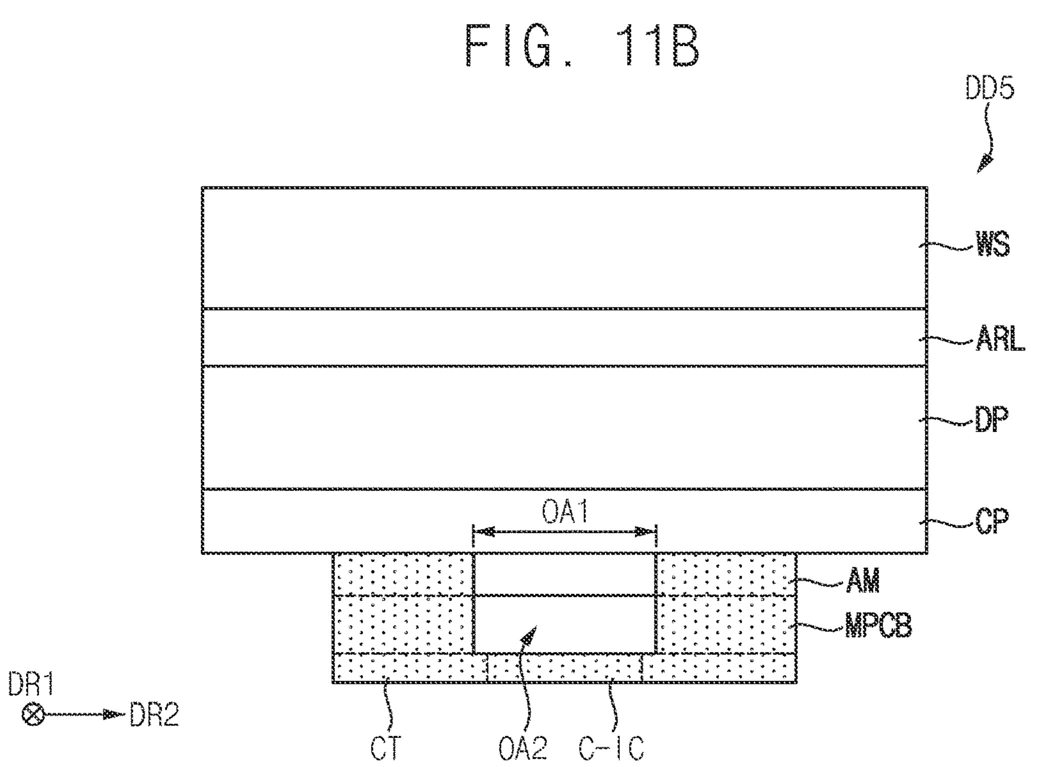
FIG. 11B is a side view illustrating the display device of FIG. 11A.
Figure 11C:
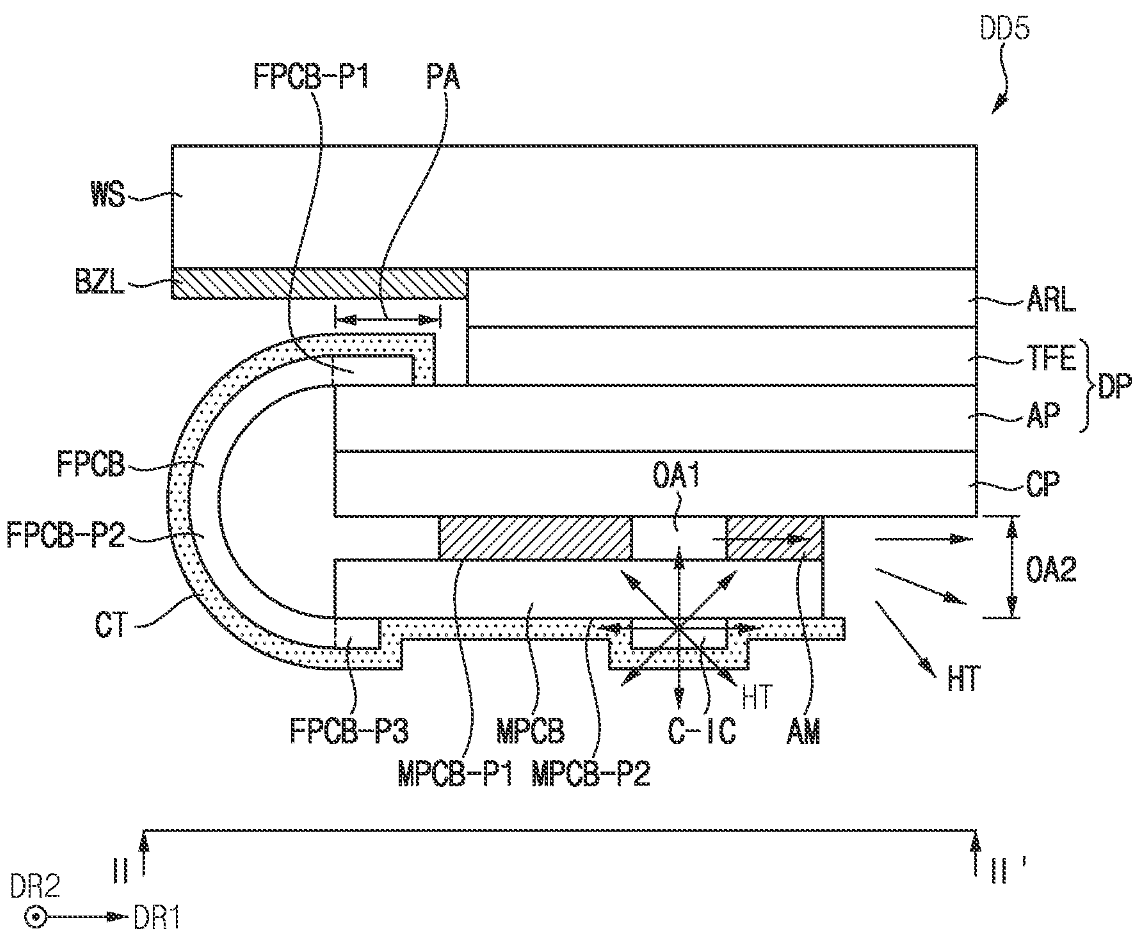
FIG. 11C is a cross-sectional view illustrating how heat is dissipated in the display device of FIG. 11A.

FIG. 11A is a cross-sectional view illustrating a display device according to an embodiment of the present disclosure. FIG. 11B is a side view illustrating the display device of FIG. 11A. For example, FIG. 11B is a side view illustrating the display device of FIG. 11A viewed from the first direction DR1. FIG. 11C is a cross-sectional view illustrating how heat is dissipated in the display device of FIG. 11A. Hereinafter, descriptions overlapping descriptions of the display device DD3 described with reference to FIG. 9 will be omitted or simplified.

Referring to FIGS. 11A, 11B, and 11C, a display device DD5 may include a cover tape CT covering each of the first circuit board FPCB, the second circuit board MPCB, and the control chip C-IC. In an embodiment, the cover tape CT may define a second opening area OA2 (i.e., a second opening) exposing a side surface of the second circuit board MPCB adjacent to the display area (e.g., the display area DA of FIG. 1). In an embodiment, the second opening may correspond to a space between the cover tape CT and a bottom surface of the cover panel CP. The side surface of the second circuit board MPCB may be exposed to the outside of the display device DD5 via the second opening. Unlike FIG. 9 in which the cover tape CT covers the side surface of the adhesive member AM and the side surface of the second circuit board MPCB, the cover tape CT may expose or may not cover the side surface of the adhesive member AM and the side surface of the second circuit board MPCB.

As illustrated in FIG. 11B, the cover tape CT may expose a part of the side surface of the adhesive member AM and a part of the side surface of the second circuit board MPCB. However, the present disclosure is not limited thereto, and the cover tape CT may expose an entirety of the side surface of the adhesive member AM and an entirety of the side surface of the second circuit board MPCB.

In the present disclosure, the adhesive member AM may define a first opening area OA1 (i.e., a first opening that penetrates the adhesive member AM) overlapping the control chip C-IC on a plane. In an embodiment, the first opening may expose a region of the second circuit board MPCB at which the control chip C-IC is disposed. The control chip C-IC may be attached to the adhesive member AM while maintaining a spaced space between the second circuit board MPCB and the cover panel CP. That is, the first opening area OA1 may be positioned between the second circuit board MPCB and the cover panel CP. Accordingly, a heat HT generated from the control chip C-IC may flow into the first opening area OA1. The second opening area OA2 may be defined by the cover tape CT, and an air passage may be formed so that the heat HT introduced into the first opening area OA1 is dissipated to the outside of the display device DD5. As a result, transfer of the heat HT generated from the control chip C-IC to the display substrate AP may be minimized by dissipating the heat HT via the air passage to the outside of the display device DD5.

The adhesive member AM illustrated in FIG. 11A may correspond to any one of the adhesive members AM illustrated in FIGS. 5, 6, and 7.

Figure 12A:
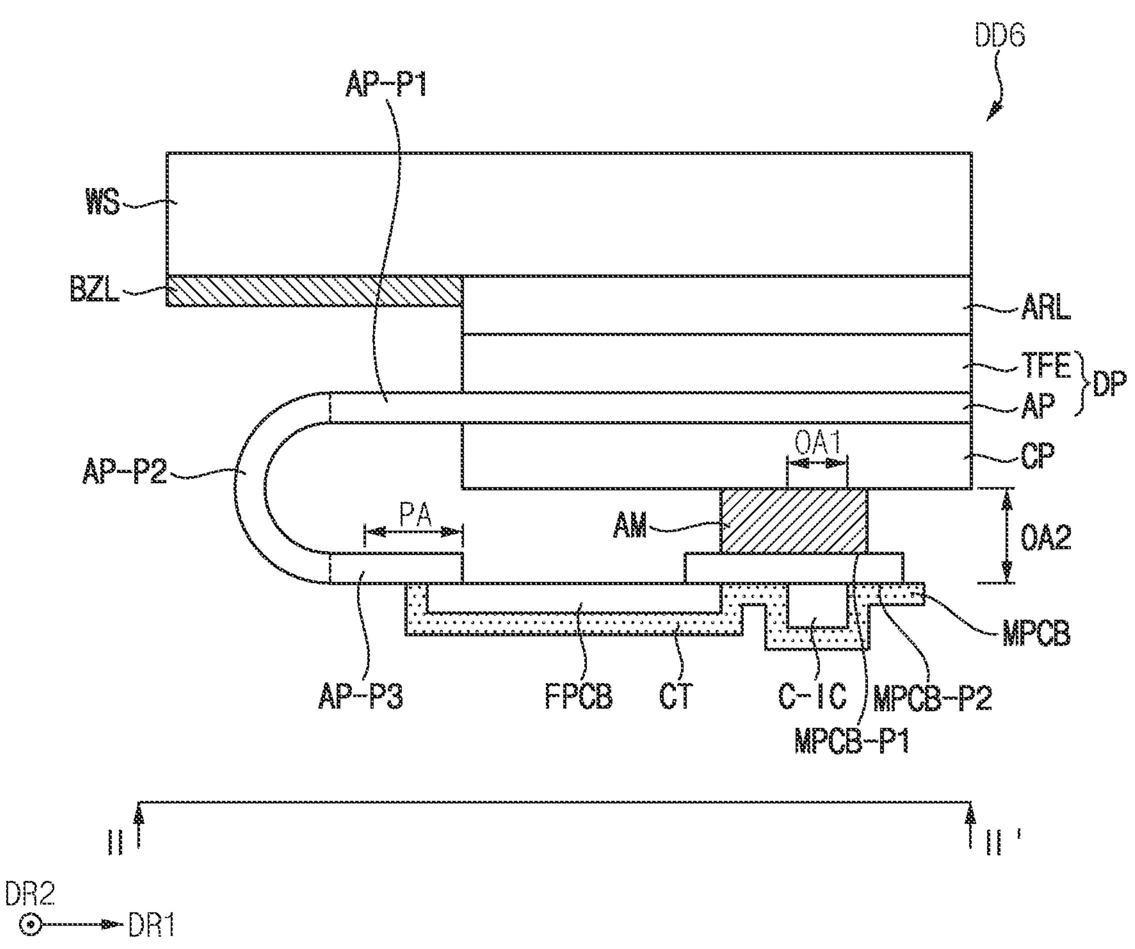
FIG. 12A is a cross-sectional view illustrating a display device according to an embodiment of the present disclosure.
Figure 12B:
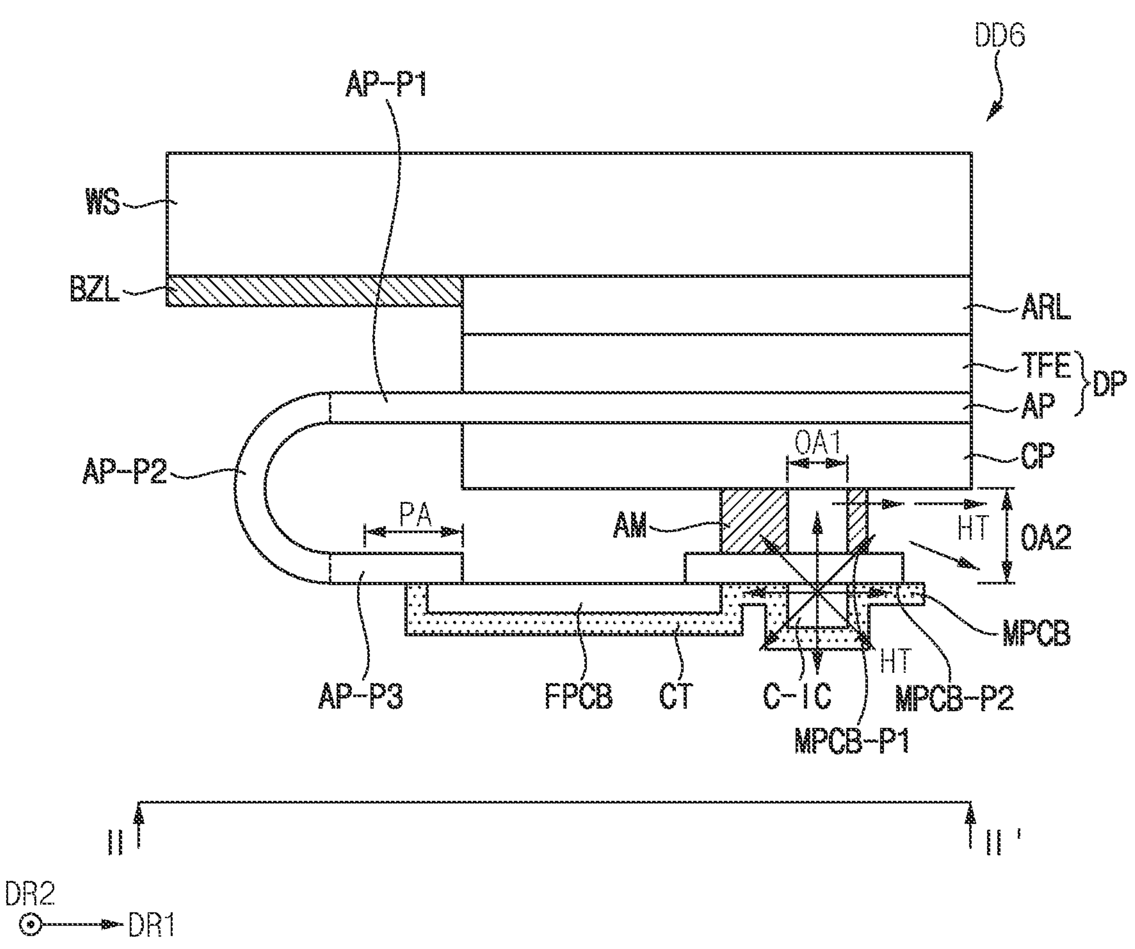
FIG. 12B is a cross-sectional view illustrating how heat is dissipated in the display device of FIG. 12A.

FIG. 12A is a cross-sectional view illustrating a display device according to an embodiment of the present disclosure. For example, FIG. 12 is a cross-sectional view illustrating an embodiment including a flexible substrate. FIG. 12B is a cross-sectional view illustrating how heat is dissipated in the display device of FIG. 12A. Hereinafter, descriptions overlapping descriptions of the display device DD5 described with reference to FIGS. 11A, 11B, and 11C will be omitted or simplified.

Referring to FIGS. 12A and 12B, unlike the display device DD5 illustrated in FIG. 11A, a display substrate AP of a display device DD6 may include a curved surface. That is, a part of the display substrate AP may be bent. Specifically, as the part of the display substrate AP is bent, the display substrate AP may include a first part AP-P1 on which the pixels are disposed, a second part AP-P2 extending from the first part AP-P1 and having a predetermined curvature value in a bent state, and a third part AP-P3 extending from the second part AP-P2 and disposed under the cover panel CP. The first circuit board FPCB may overlap a part of the pad area PA disposed in the third part AP-P3 of the display substrate AP. In an embodiment, the display substrate AP may include the first part AP-P1 on which the plurality of pixels are disposed, the second part AP-P2 having a curved shape extending around the cover panel CP and a first end connected to the first part AP-P1, and a third part AP-P3 disposed under the cover panel CP and connected to a second end, opposite to the first end, of the second part AP-P2. The second circuit board MPCB and the third part AP-P3 of the display substrate AP may be at the same height. The first circuit board FPCB may contact a bottom surface (i.e., a first surface) of the second circuit board MPCB and a bottom surface of the third part AP-P3. The cover tape CT may cover the first circuit board FPCB and the control chip C-IC. Unlike FIG. 10 in which the cover tape CT covers the side surface of the adhesive member AM and the side surface of the second circuit board MPCB, the cover tape CT may expose or may not cover the side surface of the adhesive member AM and the side surface of the second circuit board MPCB.

The cover tape CT may expose a part of the side surface of the adhesive member AM and a part of the side surface of the second circuit board MPCB. However, the present disclosure is not limited thereto, and the cover tape CT may expose an entirety of the side surface of the adhesive member AM and an entirety of the side surface of the second circuit board MPCB.

The adhesive member AM illustrated in FIG. 12A may correspond to any one of the adhesive members AM illustrated in FIGS. 5, 6, and 7.

Hereinafter, the effect of the present disclosure will be described with reference to FIGS. 3, 9, and 11A.

Display devices of Comparative Example, Example 1, Example 2, and Example 3 are driven, and the maximum temperature of each display substrate and the temperature of the control chip are measured. The brightness of the display devices is 400 nit, and the screen refresh rate of the display devices is 240 Hz.

A display device of the Example 1 (e.g., the display device DD of FIG. 3) includes an adhesive member AM defining the opening area OA1, but does not include a cover tape CT. The adhesive member AM of the Example 1 includes an optically clear adhesive film having a thickness of 1000 μm.

A display device of the Example 2 (e.g., the display device DD3 of FIG. 9) includes an adhesive member AM defining a first opening area OA1 and a cover tape CT, but the cover tape CT of the display device of the Example 2 covers a side surface of a second circuit board MPCB. The adhesive member AM of the Example 2 includes an optically clear adhesive film having a thickness of 1000 m. The cover tape CT of the Example 2 includes aluminum and black polyethylene terephthalate ("black PET").

A display device of the Example 3 (e.g., the display device DD5 of FIG. 11) includes an adhesive member AM defining a first opening area OA1 and a cover tape CT defining a second opening area OA2. The adhesive member AM of the Example 3 includes an optically clear adhesive film having a thickness of 1000 μm. The cover tape CT of the Example 3 includes aluminum and black polyethylene terephthalate.

A display device of the Comparative Example includes an adhesive member AM. The adhesive member AM of the display device of the Comparative Example overlaps the control chip C-IC on a plane. The display device of the Comparative Example does not include the cover tape CT. The adhesive member AM of the Comparative Example may be an optically clear adhesive film having a thickness of 50 μm.

Referring to Table 1 below, the maximum temperature of a display substrate AP of the Example 1 is about 7.7° C. lower than the maximum temperature of a display substrate AP of the Comparative Example. On the other hand, the temperature of the control chip C-IC of the Example 1 is about 7.5° C. higher than the temperature of the control chip C-IC of the Comparative Example.

The maximum temperature of a display substrate AP of the Example 2 is about 7.3° C. lower than the maximum temperature of the display substrate AP of the Comparative Example. The temperature of the control chip C-IC of the Example 2 is about 6.1° C. lower than the temperature of the control chip C-IC of the Comparative Example.

The maximum temperature of a display substrate AP of the Example 3 is about 8.5° C. lower than the maximum temperature of the display substrate AP of the Comparative Example. The temperature of the control chip C-IC of the Example 3 is about 4.2° C. lower than the temperature of the control chip C-IC of the Comparative Example.

TABLE 1

| | The maximum temperature of the display substrate (° C.) | The temperature of the control chip (° C.) |
|---|---|---|
| Comparative Example | 51.1 | 61.6 |
| Example 1 | 43.4 | 69.1 |
| Example 2 | 43.8 | 55.5 |
| Example 3 | 42.6 | 57.4 |

The display device according to an embodiment of the present disclosure may reduce the maximum temperature of the display substrate AP by including the adhesive member AM defining the first opening area OA1 may be confirmed.

The display device according to an embodiment of the present disclosure may effectively reduce the maximum temperature of the display substrate AP by further including the cover tape CT defining the second opening area OA2.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

a display substrate including a display area on which a plurality of pixels are disposed and a pad area adjacent to one side of the display area;

a cover panel disposed under the display substrate;

a first circuit board electrically connected to the pad area;

a second circuit board electrically connected to the first circuit board and disposed under the cover panel;

a control chip mounted on a first surface of the second circuit board; and an adhesive layer attaching the second circuit board to the cover panel, and when viewed in a plan view, defining an opening exposing a portion of the second circuit board at which the control chip is disposed.

2. The display device of claim 1, wherein a second surface opposite to the first surface of the second circuit board contacts the adhesive layer.

3. The display device of claim 1, further comprising:

an anti-reflection layer disposed on the display substrate.

4. The display device of claim 1, wherein the first circuit board includes:

a first part overlapping a part of the pad area;

a second part having a curved shape extending around the cover panel and a first end connected to the first part; and a third part disposed under the cover panel and connected to a second end opposite to the first end of the second part.

5. The display device of claim 1, wherein the adhesive layer includes a first adhesive portion and a second adhesive portion, wherein, when viewed in the plan view, the opening is disposed between the first adhesive portion and the second adhesive portion, and wherein, when viewed in the plan view, each of the first adhesive portion and the second adhesive portion is spaced apart from the control chip.

6. The display device of claim 5, wherein the adhesive layer defines a first passage area and a second passage area exposing a second surface opposite to the first surface of the second circuit board between the first adhesive portion and the second adhesive portion, wherein the adhesive layer contacts the second surface of the second circuit board, and wherein, when viewed in the plan view, the first passage area and the second passage area face each other with the control chip interposed therebetween.

7. The display device of claim 1, wherein the adhesive layer includes first, second, third, and fourth adhesive portions spaced apart from each other, and wherein, when viewed in the plan view, each of the first, second, third, and fourth adhesive portions is spaced apart from the control chip.

8. The display device of claim 7, wherein the adhesive layer defines first, second, third, and fourth passage areas exposing a second surface opposite to the first surface of the second circuit board between the first adhesive portion and the second adhesive portion, between the second adhesive portion and the third adhesive portion, between the third adhesive portion and the fourth adhesive portion, and between the fourth adhesive portion and the first adhesive portion, respectively, wherein the adhesive layer contacts the second surface of the second circuit board, wherein, when viewed in the plan view, the first passage area and the third passage area face each other with the control chip interposed therebetween, and wherein, when viewed in the plan view, the second passage area and the fourth passage area face each other with the control chip interposed therebetween.

9. The display device of claim 1, wherein the display substrate includes:

a first part on which the plurality of pixels are disposed;

a second part having a curved shape extending around the cover panel and a first end connected to the first part; and a third part disposed under the cover panel and connected to a second end opposite to the first end of the second part.

10. A display device comprising:

a display substrate including a display area on which a plurality of pixels are disposed and a pad area adjacent to one side of the display area;

a cover panel disposed under the display substrate;

a first circuit board electrically connected to the pad area;

a second circuit board electrically connected to the first circuit board and disposed under the cover panel;

a control chip mounted on a first surface of the second circuit board;

an adhesive layer attaching the second circuit board to the cover panel, and when viewed in a plan view, defining a first opening exposing a portion of the second circuit board at which the control chip is disposed; and a cover tape covering each of the first circuit board, the second circuit board, and the control chip.

11. The display device of claim 10, wherein a second surface opposite to the first surface of the second circuit board contacts the adhesive layer.

12. The display device of claim 10, wherein the cover tape is electrically connected to the pad area, the first circuit board, and the second circuit board.

13. The display device of claim 12, wherein the cover tape includes metal.

14. The display device of claim 10, wherein the first circuit board includes:

a first part overlapping a part of the pad area;

a second part having a curved shape extending around the cover panel and a first end connected to the first part; and a third part disposed under the cover panel and connected to a second end opposite to the first end of the second part.

15. The display device of claim 10, wherein the adhesive layer includes a first adhesive portion and a second adhesive portion, wherein, when viewed in the plan view, the first opening is disposed between the first adhesive portion and the second adhesive portion, and wherein, when viewed in the plan view, each of the first adhesive portion and the second adhesive portion is spaced apart from the control chip.

16. The display device of claim 15, wherein the adhesive layer defines a first passage area and a second passage area exposing a second surface opposite to the first surface of the second circuit board between the first adhesive portion and the second adhesive portion, wherein the adhesive layer contacts the second surface of the second circuit board, and wherein, when viewed in the plan view, the first passage area and the second passage area face each other with the control chip interposed therebetween.

17. The display device of claim 10, wherein the adhesive layer includes first, second, third, and fourth adhesive portions spaced apart from each other, and wherein, when viewed in the plan view, each of the first, second, third, and fourth adhesive portions is spaced apart from the control chip.

18. The display device of claim 17, wherein the adhesive layer defines first, second, third, and fourth passage areas exposing a second surface opposite to the first surface of the second circuit board between the first adhesive portion and the second adhesive portion, between the second adhesive portion and the third adhesive portion, between the third adhesive portion and the fourth adhesive portion, and between the fourth adhesive portion and the first adhesive portion, respectively, wherein the adhesive layer contacts the second surface of the second circuit board, wherein, when viewed in the plan view, the first passage area and the third passage area face each other with the control chip interposed therebetween, and wherein, when viewed in the plan view, the second passage area and the fourth passage area face each other with the control chip interposed therebetween.

19. The display device of claim 10, wherein the cover tape defines a second opening exposing a side surface of the second circuit board adjacent to the display area.

20. The display device of claim 10, wherein the display substrate includes:

a first part on which the plurality of pixels are disposed;

a second part having a curved shape extending around the cover panel and a first end connected to the first part; and a third part disposed under the cover panel and connected to a second end opposite to the first end of the second part.

21. A display device comprising:

a display substrate including a display area on which a plurality of pixels are disposed and a pad area adjacent to one side of the display area;

a cover panel disposed under the display substrate;

a first circuit board electrically connected to the pad area;

a second circuit board electrically connected to the first circuit board and disposed under the cover panel, wherein the first circuit board includes:

a first part overlapping a part of the pad area, a second part having a curved shape extending around the cover panel and a first end connected to the first part, and a third part disposed under the cover panel and connected to a second end opposite to the first end of the second part;

a control chip mounted on a first surface of the second circuit board;

an adhesive layer attaching the second circuit board to the cover panel, and when viewed in a plan view, defining a first opening exposing a portion of the second circuit board at which the control chip is disposed; and a cover tape covering the first circuit board, a portion of the second circuit board between the third part of the first circuit board and the control chip, and the control chip, wherein the cover tape and the cover panel are arranged such that a side surface of the adhesive layer and a side surface of the second circuit board are exposed to an exterior of the display device.

* * * * *